United States Patent
Okubo et al.

(10) Patent No.: US 6,512,181 B2
(45) Date of Patent: Jan. 28, 2003

(54) MULTILAYER TYPE PRINTED-WIRING BOARD AND METHOD OF MEASURING IMPEDANCE OF MULTILAYER TYPE PRINTED-WIRING BOARD

(75) Inventors: Takaharu Okubo, Ishikawa (JP); Takashi Ishikawa, Ishikawa (JP); Hiroyuki Fujita, Ishikawa (JP); Shoji Horie, Ishikawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/793,977

(22) Filed: Feb. 28, 2001

(65) Prior Publication Data

US 2002/0040809 A1 Apr. 11, 2002

(30) Foreign Application Priority Data

Mar. 2, 2000 (JP) ........................................ 2000-061874

(51) Int. Cl.[7] ................................................. H05K 1/03
(52) U.S. Cl. ........................ 174/255; 174/262; 361/777
(58) Field of Search ................................. 174/255–258, 174/260–262, 265, 266; 361/760–766, 777, 778; 333/12

(56) References Cited

U.S. PATENT DOCUMENTS

| | | | | |
|---|---|---|---|---|
| 5,023,753 A | * | 6/1991 | Abe | 361/748 |
| 5,736,681 A | * | 4/1998 | Yamamoto et al. | 174/252 |
| 5,926,377 A | * | 7/1999 | Nakao et al. | 174/255 |
| 6,084,779 A | * | 7/2000 | Fang | 174/255 |
| 6,091,310 A | * | 7/2000 | Utsumi et al. | 174/262 |
| 6,172,305 B1 | * | 1/2001 | Tanahashi | 174/255 |
| 6,215,372 B1 | * | 4/2001 | Novak | 333/12 |
| 6,246,014 B1 | * | 6/2001 | Pommer | 174/254 |
| 6,297,458 B1 | * | 10/2001 | McMillan et al. | 174/250 |
| 6,297,965 B1 | * | 10/2001 | Sasaki et al. | 307/89 |

* cited by examiner

*Primary Examiner*—David L. Talbott
*Assistant Examiner*—Tuan Dinh
(74) *Attorney, Agent, or Firm*—Ronald P. Kananen; Rader, Fishman & Grauer, PLLC

(57) ABSTRACT

The impedance of a newly manufactured data transmission wire pattern can be measured easily and accurately. A multilayer type printed-wiring board 1 comprises a pair of data transmission wire patterns 4, 5 arranged between a CPU module 2 and a memory module 3 on respective inner layer substrates 6, 7, impedance measuring wire patterns 21 and 22 arranged respectively in the layers same as those of the data transmission wire patterns 4, 5, a prepreg layer 11 arranged on the impedance measuring wire patterns 21, 22, land sections 23, 23 for signals arranged on the prepreg layer 11 and electrically connected to the impedance measuring wire patterns 21, 22 so as to be brought into contact with the signal terminal 41 of a probe 40 and a GND land section 24 also arranged on the prepreg layer 11 and electrically connected to the impedance measuring wire patterns 21, 22 so as to be brought into contact with the GND terminal 42 of the probe 40, the impedance measuring wire patterns 21, 22 having a pattern length not smaller than 30 mm that is the minimal length required for use with a TDR unit and a pattern width same as that of the data transmission wire patterns 4, 5.

7 Claims, 6 Drawing Sheets

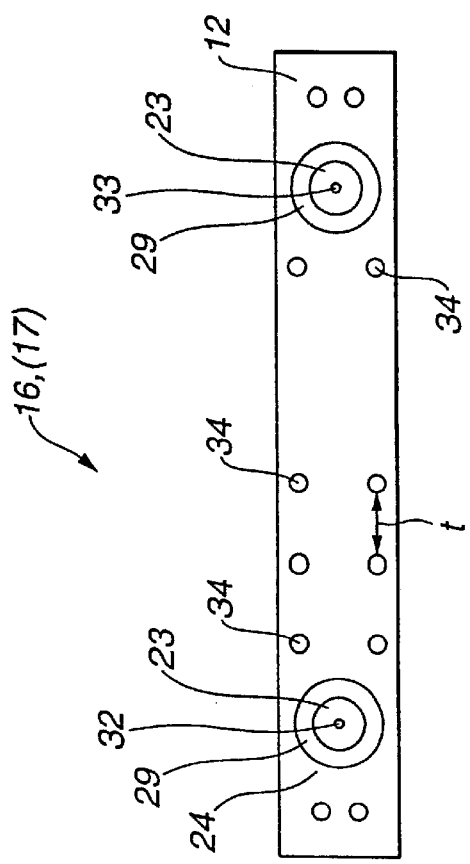
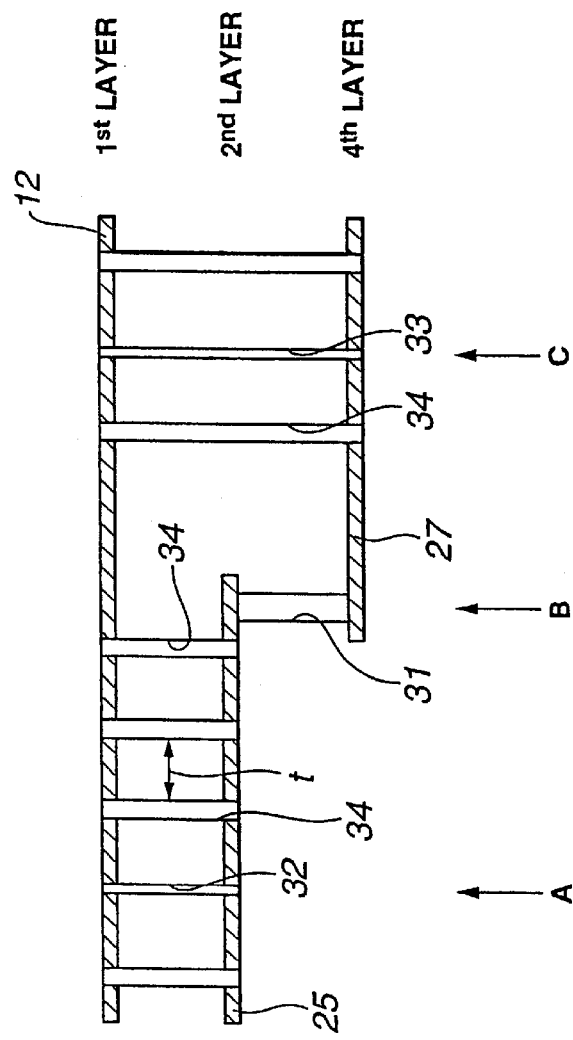
FIG.4A
FIG.4B

MULTILAYER TYPE PRINTED-WIRING BOARD AND METHOD OF MEASURING IMPEDANCE OF MULTILAYER TYPE PRINTED-WIRING BOARD

BACKGROUND OF THE INVENTION

1. Field of the Invention

This invention relates to a multilayer type printed-wiring board provided with a checking coupon for measuring the characteristic impedance of the data transmission wire pattern arranged between a CPU module and a memory module.

2. Related Background Art

Electronic devices such as game machines for home use and mobile telephone sets typically comprises a printed-wiring board arranged in the cabinet thereof and a CPU (central processing unit) module and a main memory module are mounted there along with other modules. The CPU module and the memory module are connected to each other by a data transmission wire pattern arranged on the printed-wiring board.

Meanwhile, the data transmission wire pattern of a printed-wiring board have to be designed in such a way that the impedance of the wire pattern shows a value that corresponds to the impedance specified for the CPU module and the memory module mounted on the printed-wiring board so that the CPU and the memory may operate reliably on a stable basis.

However, some of the data transmission wire patterns of the printed-wiring boards shipped from manufacturing plants after the completion of the manufacturing process can show discrepancies between the design values and the actual values due to various reasons including the conditions for etching copper foils in the data transmission wire patterns to consequently give rise to an impedance greater or smaller than the design value. When the impedance does not agree with the design value, it is no longer possible to transmit exchange signals between the CPU module and the memory module.

BRIEF SUMMARY OF THE INVENTION

In view of the above circumstances, it is therefore an object of the present invention to provide a novel multilayer type printed-wiring board adapted to measuring the impedance of the data transmission wire pattern on the manufacturing floor in an easy and simple fashion.

Another object of the present invention is to provide a multilayer type printed-wiring board comprising a pair of data transmission wire patterns arranged at the opposite sides of the inner layer substrate and adapted to measuring the impedances of the two data transmission wire patterns in a single measuring operation to improve the efficiency of the measurement process.

According to the invention, the above objects are achieved by providing a multilayer type printed-wiring board comprising;

a first insulating layer;

a data transmission wire pattern arranged on said first insulating layer and adapted to data transmission between a CPU module and a main memory module to be used for the CPU;

an impedance measuring wire pattern arranged on said first insulating layer in the layer same as that of said data transmission wire pattern with a predetermined clearance to any adjacent wiring pattern;

a second insulating layer arranged on said data transmission wire pattern and said impedance measuring wire pattern; and land sections for signals arranged on said second insulating layer and electrically connected to said impedance measuring wire pattern arranged on said first insulating layer by way of a through hole so as to be held in contact with the signal terminal of the probe for measuring the impedance of said impedance measuring wire pattern and a GND (grounding) land section held in contact with the GND terminal of said probe;

said impedance measuring wire pattern having a pattern length not smaller than about 30 mm and a pattern width same as that of said data transmission wire pattern when using a TDR (time domain reflectometer) unit.

As pointed out above, the impedance measuring wire pattern, for measuring the impedance of the multilayer type printed-wiring board is arranged in the layer same as that of the data transmission wire pattern adapted to data transmission between the CPU module and the main memory module to be used for the CPU, for which a certain level of impedance have to be secured.

Preferably, the transmission frequency of said data transmission wire pattern of said multilayer type printed-wiring board is not less than 130 MHz so as to allow high speed data transmissions.

Preferably, the clearance between said impedance measuring wire pattern of said multilayer type printed-wiring board and any adjacent wiring pattern is not less that twice of the pattern width of said impedance measuring wire pattern so as not to have any interference of the adjacent wiring pattern.

Preferably, the wiring pattern arranged around the impedance measuring wire pattern of the multilayer type printed-wiring board is a GND pattern connected to said GND land section by way of a plurality of through holes so as to eliminate any inductance component.

Still preferably, when a plurality of data transmission wire patterns are arranged in different layers in said multilayer type printed-wiring board, a plurality of impedance measuring wire patterns are arranged in different layers in correspondence to the respective data transmission wire patterns and electrically connected to each other by way of through holes.

Thus, with a multilayer type printed-wiring board according to the invention, since an impedance measuring wire pattern is arranged in the layer of the data transmission wire pattern and the pattern width that affects the impedance of the device is made equal to that of the data transmission wire pattern so that the impedance of the data transmission wire pattern can be measured accurately by means of a method of measuring the impedance of a multilayer type printed-wiring board according to the invention. The impedance of a multilayer type printed-wiring board can be measured accurately by means of a TDR (time domain reflectometer) unit when the impedance measuring wire pattern has a pattern length not smaller than about 30 mm.

BRIEF DESCRIPTION OF THE SEVERAL VIEWS OF THE DRAWING

FIG. 4A is a schematic plan view of the checking pattern of FIG. 3 and FIG. 4B is a schematic cross sectional view of the checking pattern of FIG. 3.

DETAILED DESCRIPTION OF THE INVENTION

Figure 1:
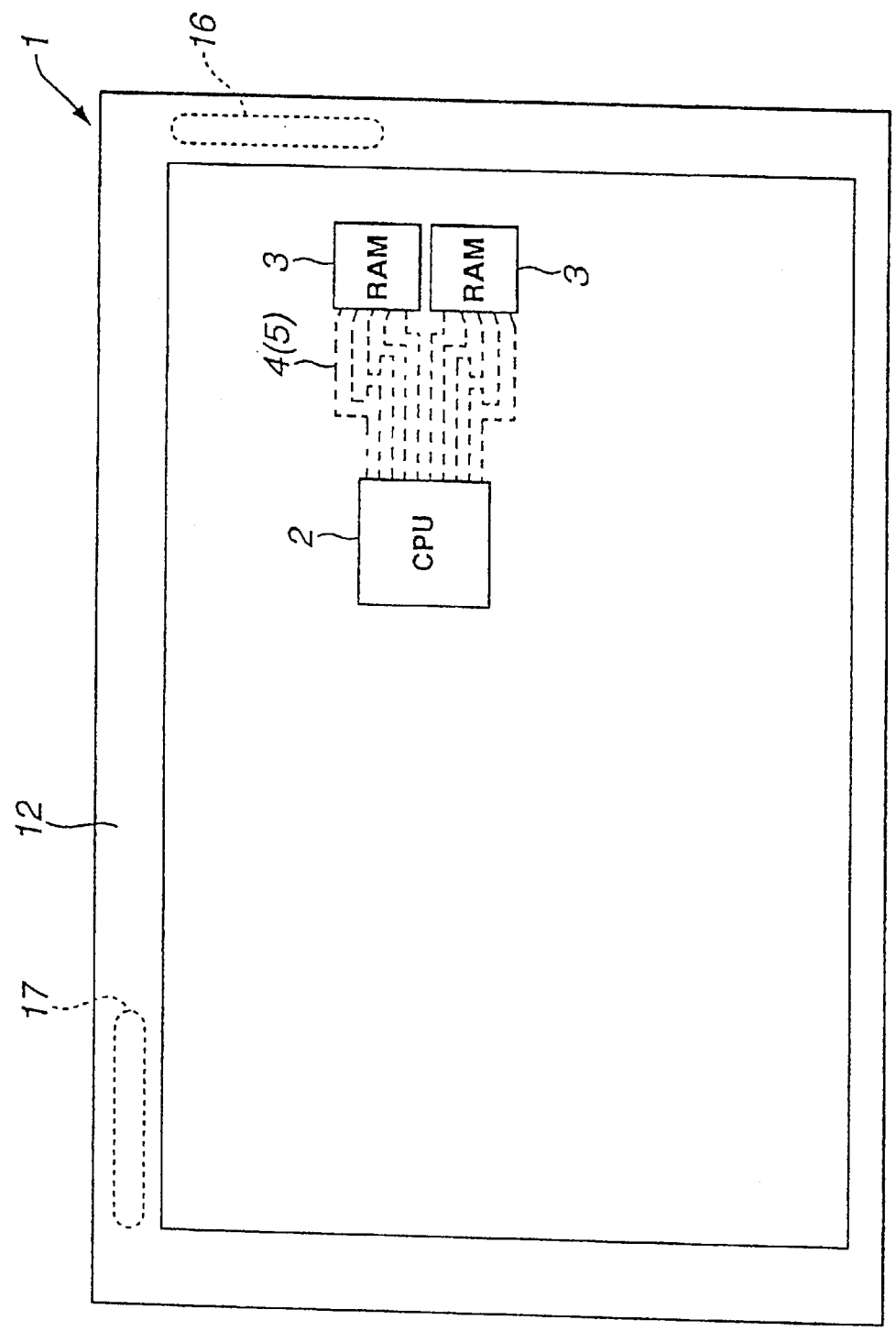
FIG. 1 is a schematic plan view of an embodiment of multilayer type printed-wiring board according to the invention.

Now, a multilayer type printed-wiring board and a method of measuring the impedance of a multilayer type printed-wiring board according to the invention will be described in greater detail by referring to the accompanying drawing. FIG. 1 is a schematic plan view of an embodiment of multilayer type printed-wiring board according to the invention. The multilayer type printed-wiring board 1 has a total of six electro-conductive layers and is adapted to be used in a game machine for home use.

Referring to FIG. 1, the multilayer type printed-wiring board 1 comprises a CPU (central processing unit) module 2 and a pair of memory modules 3, 3 to be used for the CPU module 2 that are arranged on one of the opposite sides of the multilayer type printed-wiring board 1. The CPU module 2 has an operating frequency higher than that of any ordinary CPU and is adapted to operate at a frequency above about 290 MHz or more and typically between 300 MHz and 400 MHz so that it may be able to operate for a high speed image processing operation at a rate of 66 million polygons per second. The memory modules 3, 3 operate as main memory of the CPU module 2, each having a memory capacity of 128 Mbytes. The memory modules 3, 3 are adapted to high speed serial data transmission between the CPU module 2 and themselves and typically comprises so many RDRAMs (Direct Rambus Dynamic Random-access Memories: trademark, available from Rambus Technology).

Figure 2:
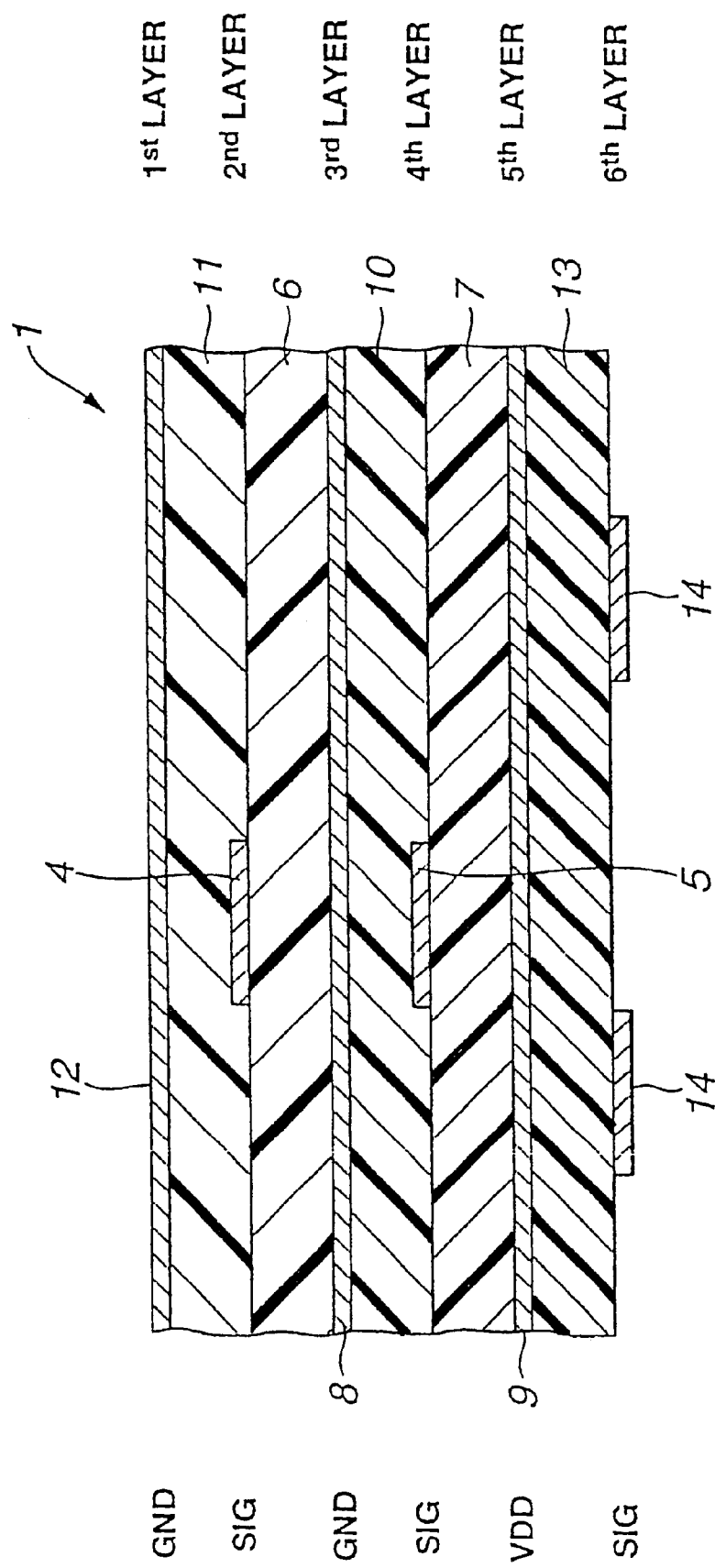
FIG. 2 is a schematic cross sectional view of a principal part of the multilayer type printed-wiring board of FIG. 1.

The printed-wiring board 1 carrying the CPU module 2 and the memory modules 3, 3 further comprises data transmission wire patterns 4, 5 operating as data transmission paths between the CPU module 2 and the memory modules 3, 3 and arranged respectively in the inner layers of the second layer and the fourth layer as shown in FIG. 2. The data transmission wire patterns 4, 5 are designed to show a transmission frequency equal to or slightly higher than the operating frequency of the CPU module 2 so that they may effectively operate for high speed data transmissions between the CPU module 2 and the memory modules 3, 3. More specifically, the data transmission wire patterns 4, 5 are designed to show a transmission frequency of about 400 MHz so as to correspond to the operating frequency between 300 MHz and 400 MHz of the CPU module 2.

The data transmission wire patterns 4, 5 are additionally designed to show an impedance with a permissible error range specified for the CPU module 2 and the memory modules 3, 3 so that the CPU module 2 and the memory modules 3, 3 may accurately identify signals and electric power is less consumed in a high speed data transmission. More specifically, the data transmission wire patterns 4, 5 are designed to show an impedance of 40±4 Ω same as the one specified for the CPU module 2 and the memory modules 3, 3 including the permissible error range.

The layered structure of the above described embodiment of multilayer type printed-wiring board 1 will be discussed below. Referring now to FIG. 2, the multilayer type printed-wiring board 1 comprises first and second inner layer substrates 6, 7. Of these, the inner layer substrate 6 carries on one of the surfaces thereof the data transmission wire pattern 4 of the second layer and on the other surface thereof a wiring pattern 8 that operates as a GND layer and forms the third layer. On the other hand, the inner layer substrate 7 carries on one of the surfaces thereof the data transmission wire pattern 5 of the fourth layer and on the other surface thereof a wiring pattern 9 that operates as a power supply layer and forms the fifth layer. Then, the inner layer substrates 6, 7 carrying thereon respectively the wiring pattern 8 of the third layer and the data transmission wire pattern 5 of the fourth layer that are arranged vis-a-vis are pressed and bonded together with a prepreg layer 10 interposed therebetween, said prepreg layer 10 being made of glass fibers impregnated with epoxy resin.

Another wiring pattern 12 that operates as a GND layer and forms the first layer is arranged on the inner layer substrate 6 with another prepreg layer 11 interposed therebetween. Still another wiring pattern 14 that operates as a signal layer and forms the sixth layer is arranged on the inner layer substrate 7 with still another prepreg layer 13 interposed therebetween. Thus, the multilayer printed-wiring board 1 having the above listed layers shows a strip line structure, in which the data transmission wire pattern 4 is sandwiched by the inner layer substrate 6 that operates as an insulating layer and the prepreg layer 11 and the insulating layer is provided on the opposite surfaces thereof with the respective wiring patterns 8, 12, whereas the data transmission wire pattern 5 is sandwiched by the inner layer substrate 7 that operates as an insulating layer and the prepreg layer 10 and the insulating layer is provided on the opposite surfaces thereof with the respective wiring patterns 8, 9.

Meanwhile, the above described data transmission wire pattern 4, 5 are required to show an impedance equal to 40 4 in order for each of the CPU modules 2 and the memory modules 3, 3 to accurately recognize signals and realize a high speed data transmission therebetween. For this purpose the multilayer type printed-wiring board 1 is provided with checking coupons 16, 17 for checking the respective impedances of the data transmission wire patterns 4, 5. More specifically, the impedance measuring wire patterns of the checking coupons 16, 17 are arranged in the respective layers of the data transmission wire patterns 4, 5 and the impedances of the impedance measuring wire patterns are observed by a TDR unit. To be more accurate, each of the checking coupons 16, 17 occupies two separates positions in order to accurately check the impedance of the data transmission wire pattern 4 or 5, whichever appropriate. Since both the checking coupons 16, 17 have a same configuration, only the checking coupon 16 will be described below.

Figure 3:
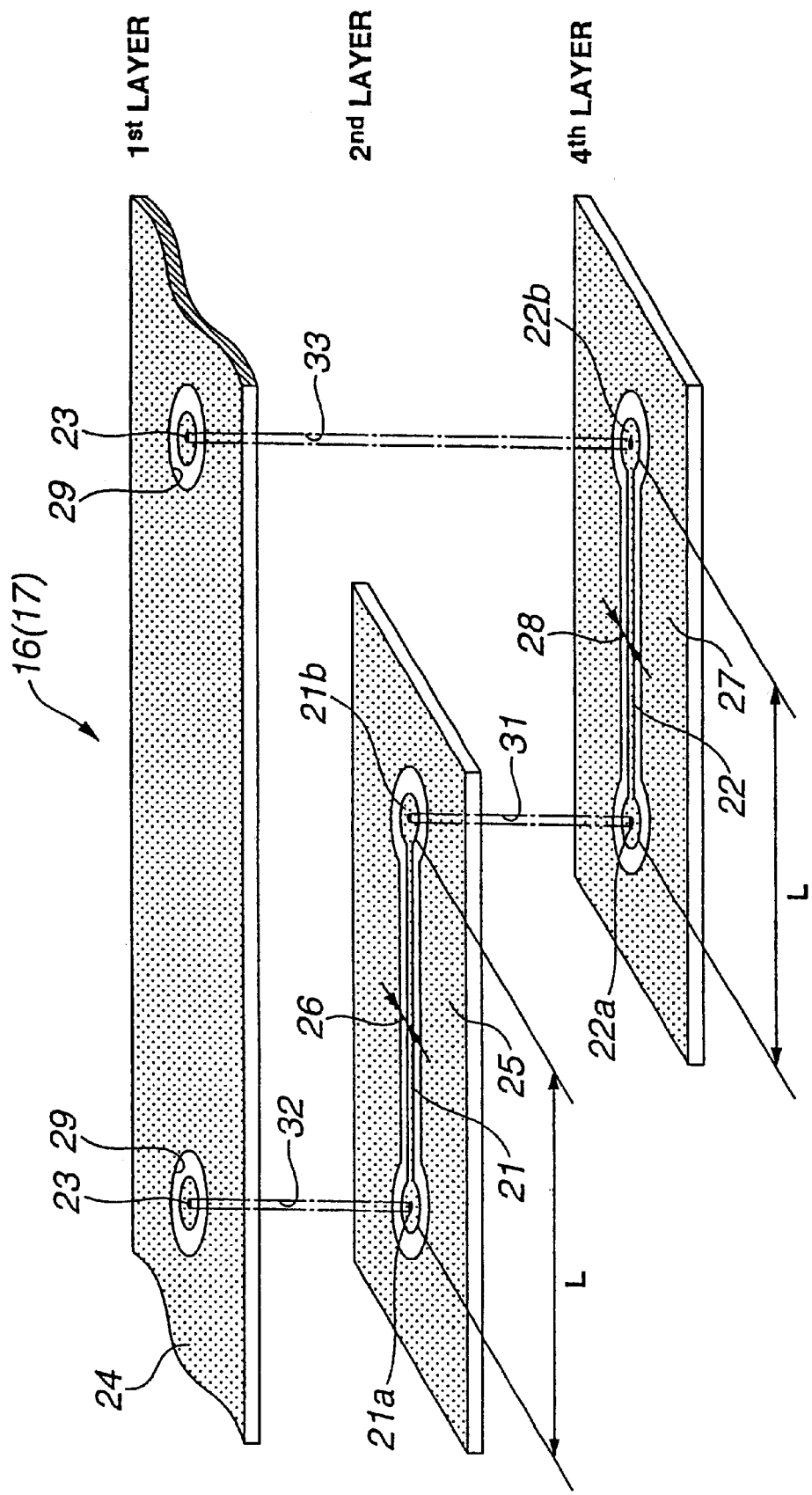
FIG. 3 is an exploded schematic perspective view of a checking pattern arranged on the multilayer type printed-wiring board of FIG. 1.

Referring to FIG. 3, the checking coupon 16 comprises a first impedance measuring wire pattern 21 for measuring the impedance on one of the opposite surfaces of the inner layer substrate 6 that operates as an insulating layer, a second impedance measuring wire pattern 22 for measuring the impedance on one of the opposite surfaces of the inner layer substrate 7 that operates as an insulating layer and land sections including land sections 23, 23 for signals and a GND land section 24 arranged on the prepreg 11 operating as an insulating layer.

The first impedance measuring wire pattern 21 arranged on one of the opposite surfaces of the inner layer substrate 6 is found in the second layer same as the data transmission wire pattern 4 and made to show a pattern width and a pattern height same as those of the data transmission wire pattern 4 so that its impedance characteristics may be identical with those of the data transmission wire pattern 4. The first impedance measuring wire pattern 21 is provided at an end thereof with a first connecting section 21a for establishing electric connection with one of the land sections 23, 23 for signals that is brought into contact with the probe arranged in the first layer and at the other end thereof with a second connecting section 21b for establishing electric connection with the second impedance measuring wire pattern 22. The first impedance measuring wire pattern 21 is also provided with a peripheral clearance 26 for preventing any electric interference of the wiring pattern 25 arranged adjacently relative to it. The clearance 26 has a width more than twice, preferably more than three times, of the width W1 of the first impedance measuring wire pattern 21 in order to reliably eliminate any interference of the wiring pattern 25. In this embodiment, the wiring pattern 25 operates as GND (ground). The first impedance measuring wire pattern 21 is formed in the step of patterning the copper foil bonded onto the inner layer substrate 6 of the second layer.

On the other hand, the second impedance measuring wire pattern 22 arranged on one of the opposite surfaces of the inner layer substrate 7 is found in the fourth layer same as the data transmission wire pattern 5 and made to show a pattern width and a pattern height same as those of the data transmission wire pattern 5 so that its impedance characteristics may be identical with those of the data transmission wire pattern 5. The second impedance measuring wire pattern 22 is provided at an end thereof with a first connecting section 22a for establishing electric connection with the second connecting section 21b of the first impedance measuring wire pattern 21 arranged in the second layer and at the other end thereof with a second connecting section 22b for establishing electric connection with the other land section 23 for signals arranged in the first layer. The second impedance measuring wire pattern 22 is also provided with a peripheral clearance 28 for preventing any electric interference of the wiring pattern 27 arranged adjacently relative to it. The clearance 28 has a width more than twice, preferably more than three times, of the width W2 of the second impedance measuring wire pattern 22 in order to reliably eliminate any interference of the wiring pattern 27. In this embodiment, the wiring pattern 27 operates as GND (ground). The second impedance measuring wire pattern 22 is formed in the step of patterning the copper foil bonded onto the inner layer substrate 7 of the fourth layer.

The prepreg layer 11 is formed on the first impedance measuring wire pattern 21 arranged on one of the surfaces of the inner layer substrate 6 and the land section 23 for signals to be brought into contact with the probe of the TDR unit for measuring impedances and the GND land section 24 are arranged in part of the wiring pattern 12 of the GND layer that is by turn arranged on the prepreg layer 11. The land sections 23, 23 for signals are made to show a substantially circular profile and the GND land 24 is arranged around the outer peripheries of the land sections 23, 23 for signals with the clearances 29 separating them from each other in order to electrically isolate it from the land sections 23, 23 for signals as part of the wiring pattern 12 arranged around the prepreg layer 11 and operating as GND.

Now, the electric connections between the land sections 23, 23 and 24 of the first layer, the first impedance measuring wire pattern 21 of the second layer and the second impedance measuring wire pattern 22 of the fourth layer will be described below. The first impedance measuring wire pattern 21 and the second impedance measuring wire pattern 22 are electrically connected to each other by way of the second connecting section 21b of the second impedance measuring wire pattern and the first connecting section 22a of the second impedance measuring wire pattern 22 illustrated in FIGS. 2 and 3. As shown in FIGS. 2 and 3, the second connecting section 21b of the second impedance measuring wire pattern 21 and the first connecting section 22a of the second impedance measuring wire pattern 22 are electrically connected to each other by bonding the inner layer substrates 6, 7 with the prepreg layer 6 interposed therebetween, subsequently boring a through hole 31 running through the second connecting section 21b and first connecting section 22a by means of a drill and forming a plating layer (not shown) on the inner wall of the through hole by means of a non-electrolytic or electrolytic plating method.

One of the land sections 23, 23 for signals of the first layer is electrically connected to the first connecting section 22a of the first impedance measuring wire pattern 21 of the second layer. On the other hand, the other land section 23 for signals and the first connecting section 22a are electrically connected to each other by boring a through hole 32 through the center of the land section 23 for signals of the substrate integrally that is formed by laying the prepreg layer 11 where the copper foil of the first layer is bonded to the inner layer substrates 6, 7 that are bonded to each other on the prepreg layer 13 where the copper foil of the sixth layer is bonded and bonding the two prepreg layers together in a press process and subsequently forming a plating layer on the inner wall of the through hole 32.

The other land section 23 of the first layer is electrically connected to the second connecting section 22b of the second impedance measuring wire pattern 22 of the fourth layer. To be more accurate, the other land section 23 for signals and the second connecting section 22b become electrically connected to each other by forming a plating layer (not shown on the inner wall of a through hole 33 that is formed simultaneously with the above described through hole 32.

Meanwhile, the first and second impedance measuring wire patterns 21, 22 are made to have a length L that is not less than about 30 mm in order to ensure that the impedance measured by means of a TDR unit shows a stable waveform.

In the case of this embodiment, the first and second impedance measuring wire pattern 21, 22 are each formed in the step of patterning the copper foil, as previously stated. In this example, the applicable transmission frequency of the first and second impedance measuring wire pattern 21, 22 arranged respectively in the layers of the data transmission wire patterns 4, 5 is 400 MHz. Therefore, if a digital signal of 400 MHz is transmitted as a base band signal, the use of a band of 1.2 GHz is required.

Since the effective wavelength $\lambda_0$ in a vacuum is expressed by the formula, $$C_0 = \lambda_0 \times f_0,$$

where $C_0$ is the light velocity in vacuum, $\lambda_0$ is the wavelength, and $f_0$ is the frequency. In applying the above formula, $f_{app}$=the applicable transmission frequency, $f_0 = f_{app} \times 3,$ $$\begin{aligned}\lambda_0 &= C_0 / f_0 \\ &= C_0 / (f_{app} \times 3) \\ &= (3 \times 10^8) / ((4 \times 10^8) \times 3) \\ &= (3 \times 10^8) / (1.2 \times 10^9) \\ &= 2.5 \times 10^{-1} = 0.25 \text{ (m)} = 250 \text{ (mm)}\end{aligned}$$

is obtained.

Therefore, the effective wavelength $\lambda_{eff}$ in a conductor is expressed by the formula below.

$$\lambda_{eff} = \lambda_0 / \sqrt{\epsilon eff \text{(coefficient of self-induction)}}$$

When the first and second impedance measuring wire pattern 21, 22 are each formed in the step of patterning the copper foil, as previously stated, ∈eff(coefficient of self-induction) being equal to 4 in the current example, and $$\lambda_{eff} = 0.25/\sqrt{4} = 0.125(m) = 125 \text{ mm}$$

When measuring impedances by means of a TDR unit, the minimal length, or min L, of the data transmission wire patterns 4, 5 is expressed by formula below.

$$\min L = \lambda_{eff}/4 = 0.125/4 = 0.03125 \text{ (m)} \approx 30 \text{ (mm)}$$

Note that min L is made equal to a quarter of the effective wavelength, or $\lambda_{eff}/4$, because it is the minimum length necessary for reproducing the original waveform, taking the influence of reflections and other factors due to mismatched impedances into consideration.

In other words, the data transmission wire patterns 4, 5 are required to have a minimal length expressed by formula below in order to measure the impedances thereof by means of a TDR unit.

$$\min L \geq \lambda_{eff}/4$$

$$\geq \lambda_0/(4 \times \sqrt{\epsilon eff\text{(coefficient of self-induction)}})$$

$$\geq C_0/(f_0 \times 4 \times \sqrt{\epsilon eff\text{(coefficientofself-induction)}})$$

$$\geq C_0/(f_{app} \times 3 \times 4 \times \sqrt{\epsilon eff\text{(coefficientofself-induction)}})$$

In this embodiment, a length of 65 mm is selected because it represents the most table value as shown in Table 1 below.

TABLE 1

| pattern length L (mm) | less than 30 | 30 | 50 | 55 | 60 | 65 | 70 | 90 | 100 or more |
|---|---|---|---|---|---|---|---|---|---|
| measured value (Ω) | un-measurable | 52.1 | 51.5 | 51.3 | 51.1 | 51.1 | 51.1 | 51.1 | 51.1 |

Meanwhile, as shown in FIGS. 4A and 4B, the wiring pattern 12 that operates as part of the checking pattern 16, the wiring pattern 25 of the second layer and the wiring pattern 27 of the fourth layer are electrically connected to each other by way of the plating layer (not shown) on the inner surfaces of the plurality of through holes 34 so as to eliminate any inductance component of the wiring patterns 25, 27. The through holes 34 are arranged at a pitch as defined below.

gap $P$ (mm)≦(propagation velocity)÷(4×thrice of applicable frequency)

≦(wavelength at 1.2 GHz in copper)/4

≦125 (mm)4

≦31.25 (mm)

Figure 5:
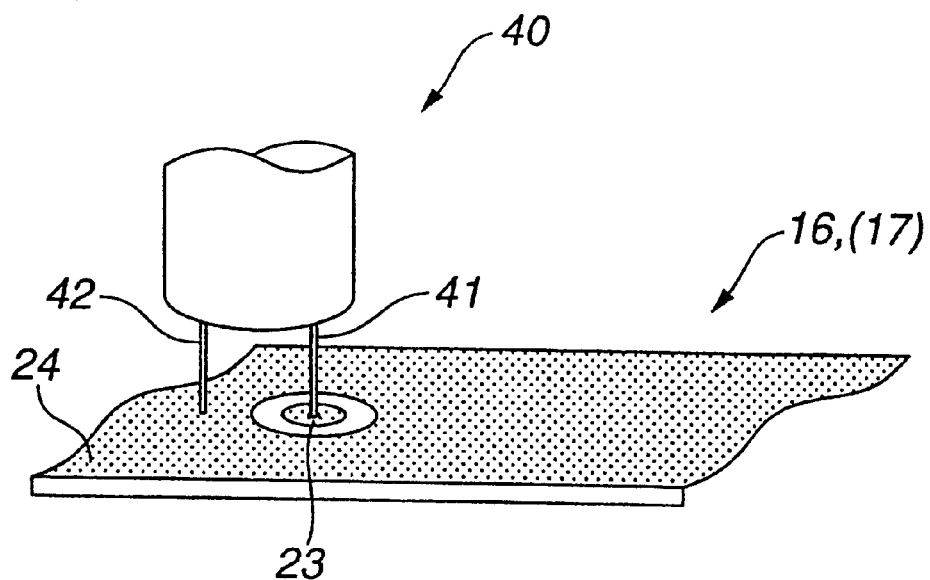
FIG. 5 is a schematic perspective view of a principal part of the multilayer type printed-wiring board of FIG. 1 being measured for impedance by means of a TDR unit.

The above described checking patterns 16, 17 are used to measure the impedances of the data transmission wire patterns 16, 17 of the multilayer type printed-wiring board 1. A TDR (time domain reflectometer) unit is typically used to observe the impedances. As shown in FIG. 5, a TDR unit comprises a probe 40 that is provided with signal terminals 41, 41 to be held in contact with the respective land sections 23, 23 for signals, to which a voltage is applied, and a GND terminal 42 to be held in contact with the GND land section 24. From the viewpoint of the checking patterns 16, 17, the signal terminals 41 are brought into contact with the respective land sections 23, 23 for signals and the GND terminal 42 is brought into contact with the GND land section 24 when measuring the impedances. The TDR unit is used to measure the impedances of the first and second impedance measuring patterns 21, 22 by determining the ratio of the voltage of the incident wave to that of the reflected wave as shown in FIG. 6.

Referring to FIG. 3, since the first impedance measuring pattern 21 and the second impedance measuring pattern 22 of the multilayer type printed-wiring board 1 are electrically connected to each other, it is possible to measure both the impedance of the first impedance measuring pattern 21 arranged in the second layer and that of the second impedance measuring pattern 22 arranged in the fourth layer in a single measuring session. In other words, the TDR unit can measure both the impedance of the first impedance measuring pattern 21 and that of the second impedance measuring pattern 22 by counting the elapsed time since the start of the measuring session.

Figure 6:
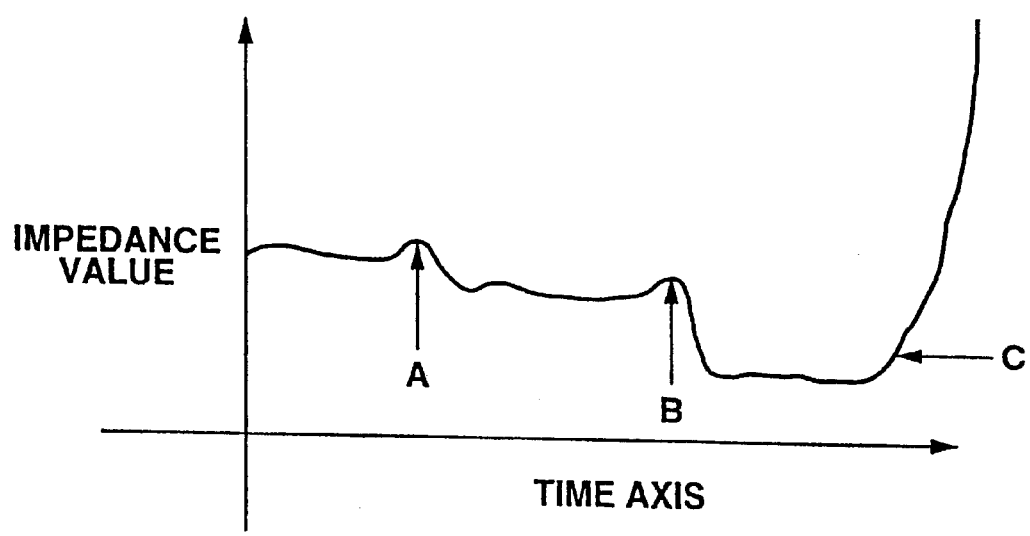
FIG. 6 is a graph illustrating the waveform of the impedance of the multilayer type printed-wiring board of FIG. 1.

Referring to FIG. 6 showing the waveform displayed on the monitoring screen of the TDR unit, the observed impedance fluctuates at point A that corresponds to the land sections 23, 23 and then fluctuates again at point B that corresponds to the second connecting section 21a and the first connecting section 22a connecting the first impedance measuring pattern 21 and the second impedance measuring pattern 22. Thereafter, the observed impedance fluctuates once again at point C that corresponds to the second connecting section 22b of the second impedance measuring pattern 22. The observed impedance is held to a constant level both in the interim between point A and point B and in the interim between point B and point C. Therefore, when the impedance is visually observed, it is possible to check the impedance of the first impedance measuring pattern 21 and that of the second impedance measuring pattern 22 by locating point A, point B and point C where the impedance fluctuates in the waveform of impedance.

With the above described multilayer type printed-wiring board 1, the impedances of the data transmission wire patterns 4, 5 can be controlled in a simple manner because the first impedance measuring pattern 21 and the second impedance measuring pattern 22 having a width and a height same as those of the data transmission wire patterns 4, 5 that are arranged in inner layers are located respectively in the layers same as those of the data transmission wire patterns 4, 5. Additionally, as shown in FIG. 3, the impedances of the wiring patterns arranged in different layers can be measured in a single measuring session to remarkably reduce the time required for the checking process because the first impedance measuring pattern 21 and the second impedance measuring pattern 22 are electrically connected to each other by way of the second connecting section 21*b* and the first connecting section 22*a*.

Figure 7:
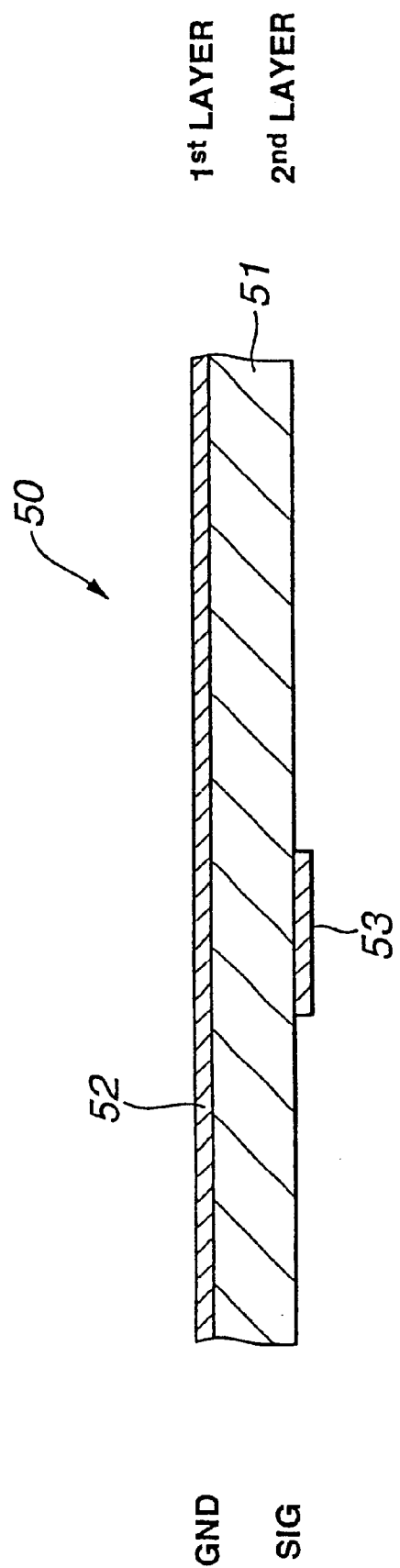
FIG. 7 is a schematic cross sectional view of another embodiment of multilayer type printed-wiring board according to the invention.

While the present invention is described above in terms of a six-layered printed-wiring board 1, the present invention is by no means limited thereto and may also be applied to a printed-wiring board as shown in FIG. 7.

Referring to FIG. 7, the printed-wiring board 50 comprises two electro-conductive layers and a first wiring pattern 52 operating as a GND layer is arranged on one of the surfaces of substrate 51 while a second wiring pattern 53 operating as a signal layer is arranged on the other surface of the substrate 51. With a printed-wiring board 50 having such a configuration, it may be so arranged that land sections for signals and a GND land section are provided at the side of the first wiring pattern 52 or the second wiring pattern 53 and a measuring probe is provided at the side of the first wiring pattern 52 or the second wiring pattern 53, respectively.

What is claimed is:

1. A multilayer type printed-wiring board comprising;

a first insulating layer;

a data transmission wire pattern formed on said first insulating layer and adapted to data transmission with a transmission frequency ($f_{app}$) between a CPU module and a main memory module to be used for the CPU;

an impedance measuring wire pattern formed on said first insulating layer with a predetermined clearance to any adjacent wiring pattern;

a second insulating layer provided on said data transmission wire pattern and said impedance measuring wire pattern; and land sections for signals formed on said second insulating layer and electrically connected to said impedance measuring wire pattern arranged on said first insulating layer by way of a through hole being held in contact with the signal terminal of the probe for measuring the impedance of said impedance measuring wire pattern by using a TDR (time domain reflectometer) unit;

a GND (grounding) land section also formed on said second insulating layer held in contact with the GND terminal of said probe;

said impedance measuring wire pattern having a pattern length L and a pattern width, said pattern width being the same as that of said data transmission wire pattern;

wherein said pattern length L is expressed by the formula:

$$L \geq \lambda_{eff}/4$$
$$\geq C_0/(f_{app} \times 3 \times 4 \times \sqrt{\epsilon eff(\text{coefficient of self-induction})}),$$

wherein $C_0$ is the light velocity in vacuum.

2. The multilayer type printed-wiring board according to claim 1, wherein the transmission frequency of said data transmission wire pattern is not less than 130 MHz.

3. The multilayer type printed-wiring board according to claim 1, wherein the clearance between said impedance measuring wire pattern and any adjacent wiring pattern is not less than twice of the pattern width of said impedance measuring wire pattern.

4. The multilayer type printed-wiring board according to claim 1, wherein the wiring pattern arranged around the impedance measuring wire pattern is a GND pattern connected to said GND land section by way of said plurality of through holes.

5. The multilayer type printed-wiring board according to claim 1, wherein said plurality of impedance measuring wire patterns are arranged in different layers and electrically connected to each other by way of through holes.

6. The multilayer type printed-wiring board according to claim 1, wherein said pattern length L is about 30 mm in a case of said transmission frequency ($f_{app}$) is about 400 MHz.

7. The multilayer type printed-wiring board according to claim 1, wherein said data transmission wire pattern is formed from copper, said $\epsilon$eff(coefficient of self-induction) being equal to 4.

* * * * *